United States Patent [19]
Ingram

[11] Patent Number: 6,100,552
[45] Date of Patent: Aug. 8, 2000

[54] MULTI-TAPPED BI-DIRECTIONAL CCD READOUT REGISTER

[75] Inventor: Simon Gareth Ingram, Waterloo, Canada

[73] Assignee: Dalsa, Inc., Canada

[21] Appl. No.: 09/081,068

[22] Filed: May 19, 1998

Related U.S. Application Data

[63] Continuation-in-part of application No. 09/006,888, Jan. 14, 1998, Pat. No. 5,929,471.
[60] Provisional application No. 60/048,348, May 30, 1997, and provisional application No. 60/051,988, Jul. 9, 1997.

[51] Int. Cl.[7] .......................... H01L 27/148; H01L 29/768
[52] U.S. Cl. .......................... 257/239; 257/236; 257/241
[58] Field of Search .................................. 257/236, 239, 257/240, 241

[56] References Cited

U.S. PATENT DOCUMENTS

| | | |
|---|---|---|
| 4,162,411 | 7/1979 | Sakaue et al. . |
| 4,280,141 | 7/1981 | McCann et al. . |
| 4,328,432 | 5/1982 | Yamazaki . |
| 4,382,267 | 5/1983 | Angle . |
| 4,426,664 | 1/1984 | Nagumo et al. . |
| 4,430,673 | 2/1984 | Salomon et al. . |
| 4,547,677 | 10/1985 | Parker . |
| 4,679,212 | 7/1987 | Hynecek . |
| 4,774,585 | 9/1988 | Suga et al. . |
| 4,780,764 | 10/1988 | Kinoshita et al. . |
| 4,782,394 | 11/1988 | Heida et al. . |
| 4,825,292 | 4/1989 | Knibbe . |
| 4,845,566 | 7/1989 | Sakai et al. . |
| 4,849,814 | 7/1989 | Van De Steeg . |
| 4,954,900 | 9/1990 | Frame . |
| 4,974,043 | 11/1990 | Stevens . |
| 5,045,932 | 9/1991 | Sharman et al. . |
| 5,105,264 | 4/1992 | Erhardt . |
| 5,114,237 | 5/1992 | Cazaux . |
| 5,146,321 | 9/1992 | Lees et al. . |
| 5,196,939 | 3/1993 | Elabd et al. . |
| 5,264,939 | 11/1993 | Chang . |
| 5,272,535 | 12/1993 | Elabd . |
| 5,285,286 | 2/1994 | Kannegundla . |
| 5,336,910 | 8/1994 | Murakaumi ......................... 257/239 |
| 5,442,208 | 8/1995 | Bosiers et al. . |
| 5,491,512 | 2/1996 | Itakura et al. . |
| 5,510,836 | 4/1996 | Stekelenburg . |
| 5,591,660 | 1/1997 | Fujikawa et al. . |
| 5,608,242 | 3/1997 | Kamasz et al. . |
| 5,614,740 | 3/1997 | Gardner et al. . |
| 5,646,427 | 7/1997 | Smith et al. . |
| 5,650,352 | 7/1997 | Kamasz et al. . |
| 5,990,503 | 11/1999 | Ingram et al. ......................... 257/236 |

FOREIGN PATENT DOCUMENTS

| | | |
|---|---|---|
| 5-37861 | 2/1993 | Japan . |

*Primary Examiner*—Ngân V. Ngô
*Attorney, Agent, or Firm*—Banner & Witcoff, Ltd.

[57] ABSTRACT

A bi-directional multi-tapped CCD sensor readout structure includes a well formed in a substrate, a channel formed in the well defining a channel direction, and a clocking structure disposed over the channel and oriented transversely to the channel direction. The clocking structure includes a plurality of register element sets. A first register element set includes a first floating sensing conductor and a plurality of clock signal conductors. The plurality of clock signal conductors includes a first clock signal conductor under which is defined a first junction at the electrical semiconductor junction between the well and the substrate and a second junction at the electrical semiconductor junction between the channel and the well. The first and second junctions define an inter-junction separation. The well is formed in the substrate and the channel is formed in the well so that a length of the inter-junction separation is controllable by a first clock signal applied to the first clock signal electrode. A clock signal source provides to the first clock signal conductor a first clock signal as either a clock high value, a clock low value and a reset value, the clock low value being a value between the clock high value and the reset value. The length of the inter-junction separation is zero when the first clock signal is the reset value.

27 Claims, 4 Drawing Sheets

MULTI-TAPPED BI-DIRECTIONAL CCD READOUT REGISTER

The priority benefit of the filing date of Ser. Nos. 60/048,348 filed May 30, 1997 and 60/051,988 filed Jul. 9, 1997 and, a CIP of Ser. No. 09/006,888 filed Jan. 14, 1998 U.S. Pat. No. 5,929,471 are hereby claimed.

BACKGROUND OF THE INVENTION

1. Field of the Invention

The present invention relates to a bi-directional horizontal readout register of a CCD imaging sensor. In particular, the invention relates to use of a non-destructive readout floating gate sensing electrode to sense the readout register and a vertical anti-blooming structure to reset the horizontal readout register.

2. Description Of Related Art

Charge coupled devices (hereinafter CCDs) are widely used in video imaging and recording applications. For example, the architecture of a CCD video sensor may follow the form dictated by the National Television Standards Committee (NTSC) for video broadcast standards. Such CCD video sensor designs need at least 488 TV lines vertically, 500 to 800 pixels per TV line, have an optical format of 4/3 aspect ratio, and generate field interlaced video at a frame rate of 30 Hz. CCD architectures which achieved the goals of the video format imaging requirements generally fall into two categories: Interline Transfer (ILT) or Frame Transfer (FT) image sensors.

An alternative application of a CCD sensor is industrial inspection or vision equipment. The architecture of a CCD video sensor for this application may be optimized for maximum pixel resolution, or to maximize image frame rate, or both. Often inspection cameras used to inspect moving objects (e.g., on a continuous conveyor belt or rolled goods such as rolls of cloth) employ a line scan CCD sensor where a linear CCD sensor is oriented in a direction perpendicular to the direction of movement of the object being imaged. Advanced linear CCD sensors often employ a time delay and integrate technology and are referred to as TDI CCD sensors.

Two dimensional imaging arrays generally take a snap shot of an image where the whole photoactive array of pixels integrates photogenerated charge for a period of time. At the end of the integration time, the information is transferred from the sensor to an external circuit element using a parallel to serial transfer scheme. Each line of pixel data is transferred into a horizontal readout CCD shift register. The line of data is then transferred serially to an output device at the end of the register.

The data rate at which signal charge can be transferred out of the sensor is limited by a number of factors. Two factors such are the rate at which charge can be transferred along a single CCD readout register and the bandwidth of the output device. Clocking the readout register too fast may result in incomplete charge transfer and resultant image blur. In applications where the sensor data rate must be in excess of the amplifier bandwidth, the horizontal CCD readout shift register is partitioned into subregisters or segments. Each subregister or register segment will then transfer signal charge to its own separate output device which operates at the bandwidth limit of its own output device. The data is then multiplexed off-chip to reconstruct the image at the higher data rate which is the amplifier bandwidth multiplied by the number of output devices or taps. This register architecture is known as a multi-tapped horizontal readout register.

A charge coupled device image sensor employing multiple outputs to increase the total output data transfer rate requires that the CCD register be interrupted in some way at each tap point of its multi-tapped horizontal readout register. This tap may be in the form of a floating diffusion node disposed at multiple points along and within the length of the readout register, or it may be in the form of a floating gate electrode disposed across the horizontal readout register at multiple points along the length of the readout register.

In previous work, multiple "floating diffusion" readout nodes were place in the horizontal readout register such as U.S. Pat. No. 5,608,242 granted to Kamasz. However, such a horizontal readout structure is not bi-directional. To make such a readout register bi-directional, it is necessary to place a diffusion node, and output structure, at each end of each register segment. Such an architecture needs to insert many diffusion nodes within the length of the multi-tapped horizontal readout register.

SUMMARY OF THE INVENTION

It is an object to the present invention to provide a bi-directional multi-tapped horizontal readout register without segment breaks. It is another object to provide the multi-tapped readout register with very rapid pixel discharge without interfering with multi-tap output structures.

These and other objects are achieved in a bi-directional multi-tapped CCD sensor readout structure that includes a potential well formed in a substrate, a channel formed in the well so as to define a channel direction, and a clocking structure disposed over the channel and oriented transversely to the channel direction. The clocking structure includes a plurality of register element sets. A first register element set includes a first floating sensing conductor and a plurality of clock signal conductors. The plurality of clock signal conductors includes a first clock signal conductor under which is defined a first junction at the electrical semiconductor junction between the well and the substrate and a second junction at the electrical semiconductor junction between the channel and the well. The first and second junctions define an inter-junction separation. The well is formed in the substrate and the channel is formed in the well so that a length of the inter-junction separation is controllable by a first clock signal applied to the first clock signal electrode. A clock signal source provides to the first clock signal conductor a first clock signal as either a clock high value, a clock low value and a reset value, the clock low value being a value between the clock high value and the reset value. The length of the inter-junction separation is zero when the first clock signal is the reset value.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

A floating gate electrode disposed across the horizontal readout register at multiple points along the length of a horizontal readout register may be used to improve sensor readout speed. However, while the floating gate electrode non-destructively senses charge as the charge is shifted by the electrode, the floating gate electrode does not have a means to discharge the signal charge contained in the channel into a drain without injecting unwanted signals into the output. Before a new line of data from an imaging area is set into the horizontal readout register, the old line of data needs to be discharged.

The present invention includes three alternative discharge variations. A preferred discharge means is to operate the clock lines that drive the horizontal readout register so as to affect a vertical anti-blooming structure. An alternative discharge means is to provide elongate drain segments parallel to segments of the horizontal readout register with discharge gate electrodes provided to control the discharge from the readout register into the drain. The horizontal readout register is clocked rapidly to transfer signal charge under the nearest discharge gate electrode into the nearest drain. Unfortunately in this "fast flush" discharge means, the discharge gate electrode could potentially interfere with the output structures. Another alternative is to provide drains at either end of the horizontal readout register, and after all signal charges have been readout serially from the horizontal readout register, the charges are rapidly transferred into the drain at one end of the readout register. Unfortunately, this "slow flush" discharge requires many clock cycles, and even with a fast clock mode, much time is consumed before complete discharge is achieved. This tends to reduce the fast transfer advantage of the multi-tapped readout register architecture.

Figure 1:
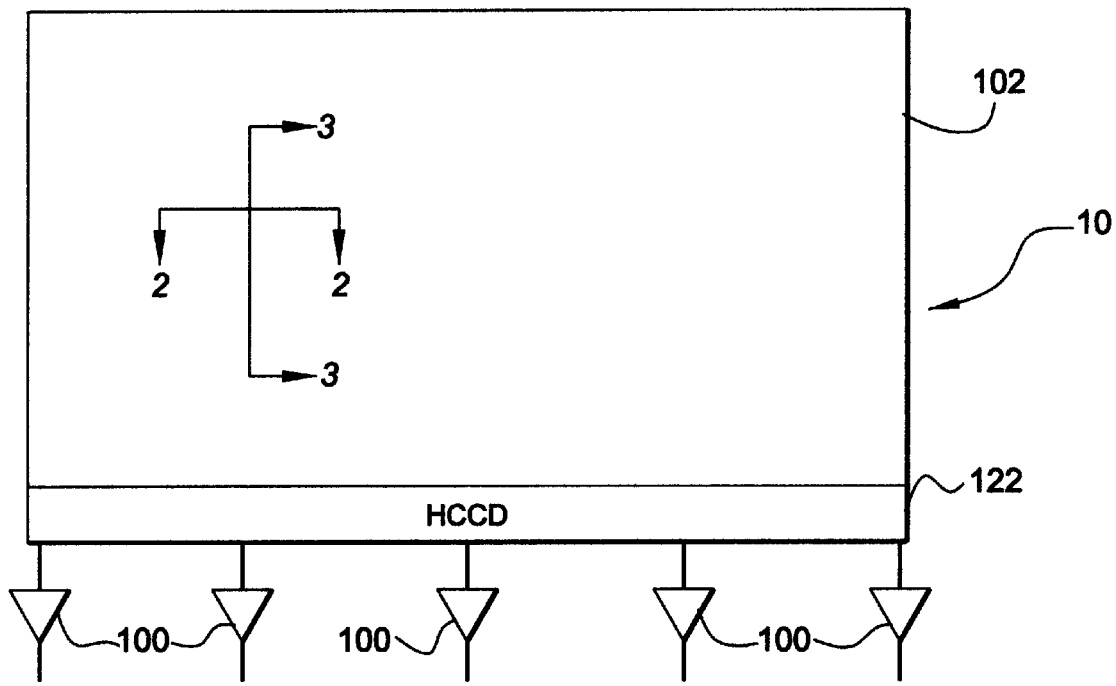
FIG. 1 is a plan view of the present invention.

In FIG. 1, CCD sensor 10 includes imaging section 102 and multi-tapped horizontal readout register 122 connected to a plurality of buffer amplifiers 100. Imaging section 102 includes a plurality of channel structures to form a frame transfer, inter-line transfer or hybrid architecture. FIG. 1 depicts the location of channel structure cross section 2–2' which is shown in FIG. 2 and channel structure longitudinal section 3–3' which is shown in FIG. 3.

Even though FIG. 1 shows five buffer amplifiers, FIG. 1 depicts multi-tapped horizontal readout register with only four active taps. A fifth tap is inactive. The readout register is designed to operate by shifting signal charge in either direction: left or right. The five taps divides the readout register into four segments. When shifting right, each segment ends in a tap connected to a buffer amplifier so that the tap on the far left is inactive. When shifting left, each segment also ends in a tap connected to a buffer amplifier so that the tap on the far right is inactive.

Figure 2:
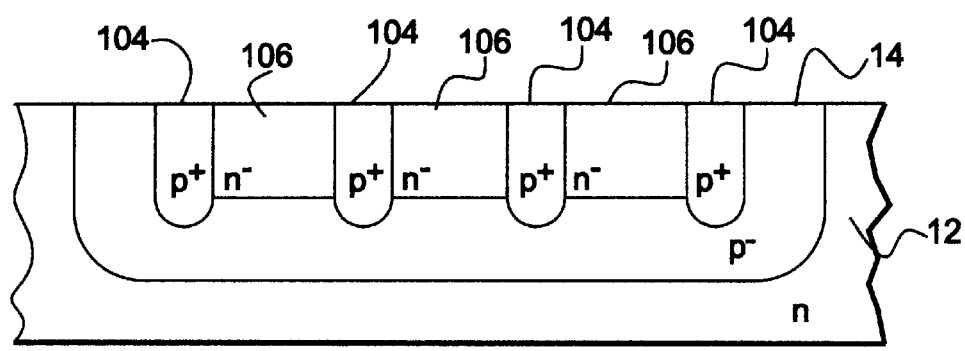
FIG. 2 is a cross section view through the imaging area of FIG. 1.

In FIG. 2, well 14 (e.g., formed of a F semiconductor conductivity type) is formed in semiconductor substrate 12 (e.g., formed of an N semiconductor conductivity type). A surface semiconductor region (e.g., formed of a N⁻ semiconductor conductivity type) is formed in well 14. A plurality of channel stops 104 (e.g., formed of a P⁺ semiconductor conductivity type) are formed longitudinally (i.e., vertically as depicted in FIG. 1) in the surface semiconductor region (e.g., formed of a N⁻ semiconductor conductivity type) so as to define a plurality of longitudinal channels 106 (e.g., formed of the surface semiconductor region of N⁻ semiconductor conductivity type) disposed between respective channel stops 104. Bias potential is applied between substrate 12 and well 14 to reverse bias the electrical junction therebetween. Potential is applied through channel stops 104 or directly by contact to well 14. In either case, channel stops 104 are of the same conductivity type as well 14 so that the channel stops and the well are in electrical communication. A potential is applied to channels 106 so that the semiconductor junctions between well 14 and channels 106 are reverse biased and channels 106 are electrically isolated from each other and from well 14 and from channel stops 104. An insulator (not shown) is formed over the channels, the channel stops and the well to surround and isolate the channels with either an insulator or a reverse biased semiconductor junction. A clock bus structure (not shown in FIG. 2) is formed over the insulator. A clock signal source (not shown) provides clock signals to the clock bus structure to form periodic potential wells in the channel structure in which charge packets accumulate and are transferred to adjacent wells.

Figure 3:
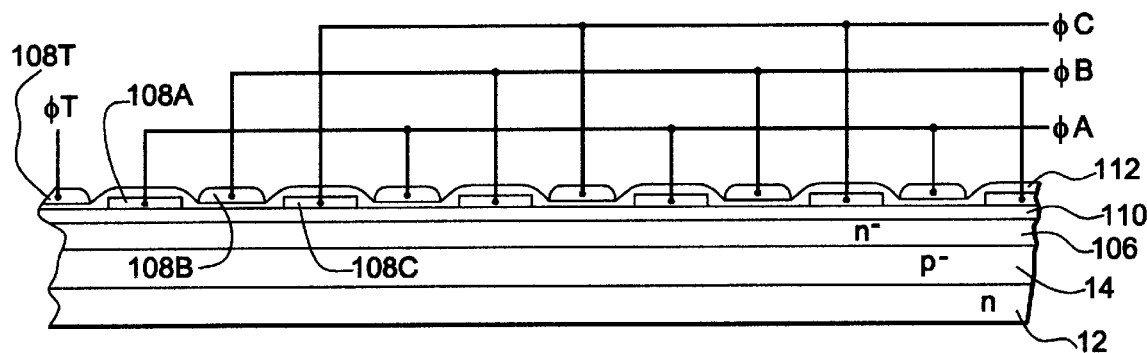
FIG. 3 is a longitudinal section view of the imaging area of FIG. 1.

FIG. 3 depicts a longitudinal section view of channel structure 106 formed in well 14 formed in substrate 12. Insulator 110, preferably formed of silicon dioxide, is formed over the channel structure, and clock lines 108A, 108B, 108C, preferably formed of poly-crystalline silicon (hereinafter, poly), are disposed over insulator 110 so as to be transverse to channel structure 106 (a cross section of the clock lines being shown in FIG. 3). Insulator 112 is formed over the clock lines and additional clock lines are formed over insulator 112. Clock lines associated with phase A are labeled 108A; clock lines associated with phase B are labeled 108B; and clock lines associated with phase C are labeled 108C. While a three phase clock line structure is shown, the clock line structure may be organized to support other phasing and clocking schemes.

Figure 4:
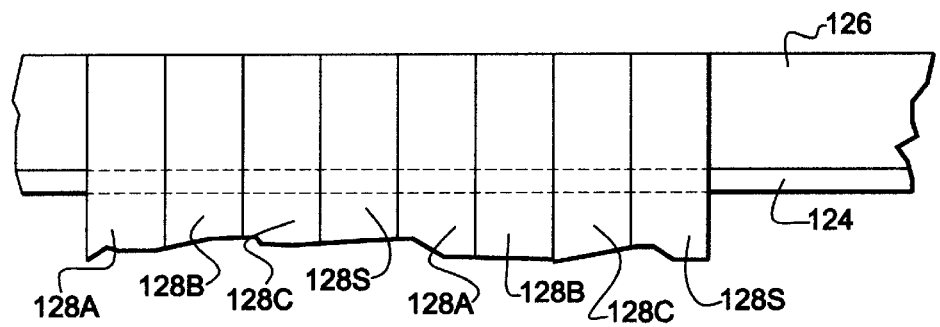
FIG. 4 is a plan view of the readout register of FIG. 1.

The last clock line at the end of a vertical channel (i.e., depicted as vertical in FIG. 1) in imaging section 102 (FIG. 1) is labeled 108T and is used to transfer charge into horizontal readout register 122 (FIG. 1). FIG. 4 depicts a portion of horizontal readout register 122. Register 122 includes horizontal channel structure 126 and a single stop 124 formed opposite the side where register 122 joins imaging section 102. Disposed transversely over and insulatively spaced from horizontal register structure 126 is a plurality of poly gates 128, collectively forming a clocking structure. FIG. 4 depicts what appears to be a four phase clocking structure comprising clock lines 128A, 128B, 128C and 128S; however, as discussed below, poly lines 128S are sensing lines, not clock lines. The clocking structure depicted in FIG. 4 is a three phase clocking structure. The clock line structure for readout register 122 may be organized to support other phasing and clocking schemes.

Figure 5:
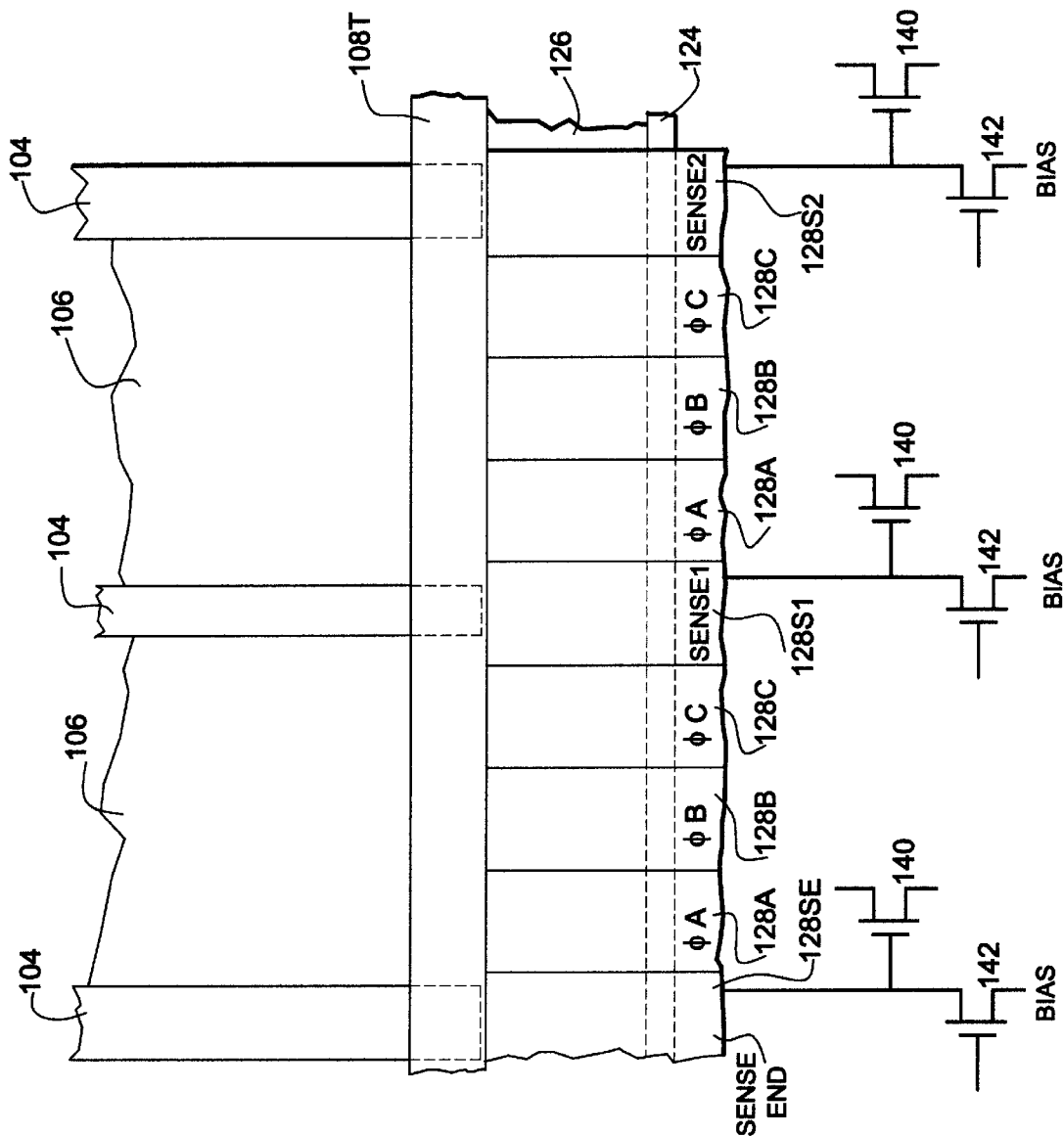
FIG. 5 is an enlargement of FIG. 4.

FIG. 5 depicts a region at the interface between imaging section 102 and horizontal readout register 122 of FIG. 1. Plural vertical channel structures 106 of imaging section 102 are isolated from each other by channel stops 104. While most of the imaging section clock structure is not shown for clarity, transfer clock line 108T is shown as the last clock line and adjacent to horizontal readout register 122. Horizontal channel 126 is disposed between a single channel stop 124 and imaging section 102. A plurality of poly lines are depicted showing a three phase clock structure with clocking lines 128A, 128B and 128C and interspersed sensing lines 128S. Charge transferred from vertical channels 106 under transfer gate electrode 108T is received in a potential well formed beneath one of the clocking gate electrodes, for example gate electrode 128B, while the other clocking gate electrodes form a barrier to change migration. Sensing electrode 128S is preferably coupled to a gate of a MOS transistor arranged as a source follower, and thus, electrode 128S is electrically isolated from a reference potential (e.g., well 14, FIG. 6) so it is regarded as a "floating electrode". The source follower preferably forms the first stage of a buffer amplifier such as amplifier 100 in FIG. 1.

Sensing electrode 128S does not ordinarily have an applied potential since it is floating, and thus, it does not affirmatively form either a potential well or barrier in horizontal channel 126. The poly-crystalline silicon that forms sensing electrode 128S and a gate electrode of a MOS FET 140 operate as a single electrically floating structure. It is desirable to periodically set the potential on this single electrically floating structure to a known value, preferably between clock high and clock low, before reading out the sensor. This is best achieved by providing another MOS FET 142 arranged as a switch to selectively couple the single electrically floating structure (i.e., sensing electrode 128S and a gate electrode of a source follower MOS FET 140) to an external bias potential. A source (or drain) of the MOS FET switch is connected to the single electrically floating structure and a drain (or source) of the MOS FET switch is connected to the external bias potential. A separate MOS FET switch is provided for each sensing electrode 128S. A potential on the gate electrode of all of the MOS FET switches is controlled to periodically connect the external bias potential to the sensing electrodes 128S. This serves to periodically reset the potential on sensing electrodes 128S. This reset operation need not be performed during data readout, thus perserving the low noise benefits of this invention. Once set to a fixed bias potential, the electrically floating structure may collect stray charges over time, and therefore, the potential may drift. It is preferrable to periodically reset this potential at some convenient time, such as each time a line of data has been read out.

Clock lines 128A, 128B, 128C and sensing electrode 128S repeat at a pitch X along the longitudinal direction of readout register 122. Pitch X is equal to the separation between adjacent channel stops 104. It would be possible to provide as many taps as there are vertical channels 106 since there is a one to one correspondence between vertical channels 106 and sensing electrodes 128S. However, a more practical sensor results when several vertical channels transferred into the horizontal shift register and then serially read out through a corresponding sensing electrode 128S. For example, consider an area sensor with 512 pixels in each of 512 vertical channels 106 and a horizontal readout register divided into 16 segments of 32 elements each. There would be 16 active taps plus one inactive tap since the readout register is capable of being shifted in either direction. Once the readout register is loaded from imaging section 102, it is shifted 32 times to pass charge non-destructively under each of the 16 sensing electrodes 128S. The signal charge is capacitively coupled to buffer amplifier 100 (FIG. 1) through floating sensing electrode 128S.

Such a readout mechanism is non-destructive, and thus, charge in readout register 122 must be discharged before a new line of data is transferred from imaging section 102 (FIG. 1) under transfer gate 108T (FIG. 5) into horizontal channel 126 (FIG. 5).

Figure 6:
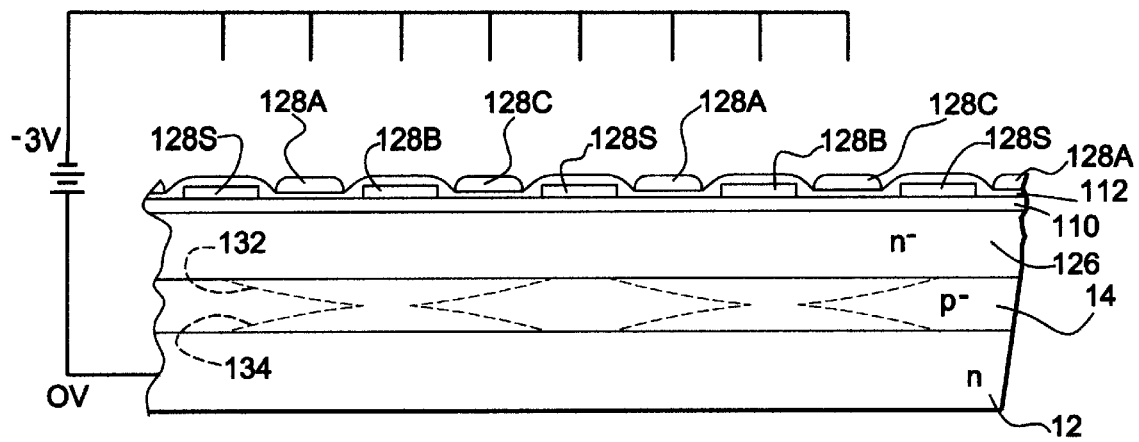
FIG. 6 is a longitudinal section view through the readout register of FIG. 1.

In FIG. 6, first electrical junction 132 is defined at an electrical semiconductor junction between horizontal channel 126 and the well 14, and a second electrical junction 134 is defined at an electrical semiconductor junction between well 14 and substrate 12. An inter-junction separation under clock electrodes 128A, 128B, 128C is defined between the first and second electrical junctions. A length of the inter-junction separation is controllable by the bias voltage applied to clock electrodes 128A, 128B, 128C. The bias voltage is preferably defined to be the potential on the electrodes relative to the potential of well 14 (FIG. 6). The length of the inter-junction separation is zero when bias voltage applied to clock electrodes 128A, 128B, 128C is set to a reset value (e.g., −3 volts) and substrate 12 and channel 126 electrically communicate. When the voltage applied to clock electrode 128B is a clock high value (e.g., +5 volts), a potential well is formed under clock electrode 128B suitable for storing a maximum design signal charge. When the voltage applied to clock electrodes 128A, 128C is a clock low value (e.g., 0 volts), a potential well of minimal (even nil) capacity is formed under clock electrodes 128A, 128C, the minimal capacity well being suitable for acting as a barrier to hold signal charge in a well under an adjacent clock electrode 128B.

Clock phase signals that apply voltages to clock lines 128A, 128B and 128C are ordinarily controlled to alternate between the clock high value and the clock low value to transfer charge in the channel direction down the channel.

However, after charge in a horizontal readout register segment has been shifted past the tap sensing electrode 128S (i.e., read out through buffer amplifier 100), it is necessary to reset horizontal readout register 122 before a new line of data is transferred from imaging section 102 (FIG. 1) under transfer gate 108T (FIG. 5) into horizontal channel 126 (FIG. 5). To reset horizontal readout register 122, a bias voltage equal to the reset value (e.g., −3 volts) is applied to clock electrodes 128A, 128B, 128C, and any signal charge held in wells under clock electrodes 128A, 128B, 128C will be discharged into substrate 12.

FIG. 6 depicts a section through the readout register with a reset value of a voltage applied to clock lines 128A, 128B and 128C so as to distort first and second electrical junctions 132, 134. In fact, the length of the inter-junction separation is reduced to zero by applying a bias voltage at the reset value (e.g., −3 volts) to clock electrodes 128A, 128B, 128C so that substrate 12 and channel 126 electrically communicate. Ordinarily, charge that may exist under sensing electrode 128S is also discharged by this mechanism due to natural diffusion migration (if time allows) or due to diffusion induced by a slight voltage gradient in this region. However, it does not matter if complete discharge of the channel under sensing electrode 128S is not achieved since any residual signal will not interfere with subsequent readout mechanisms.

Figure 7:
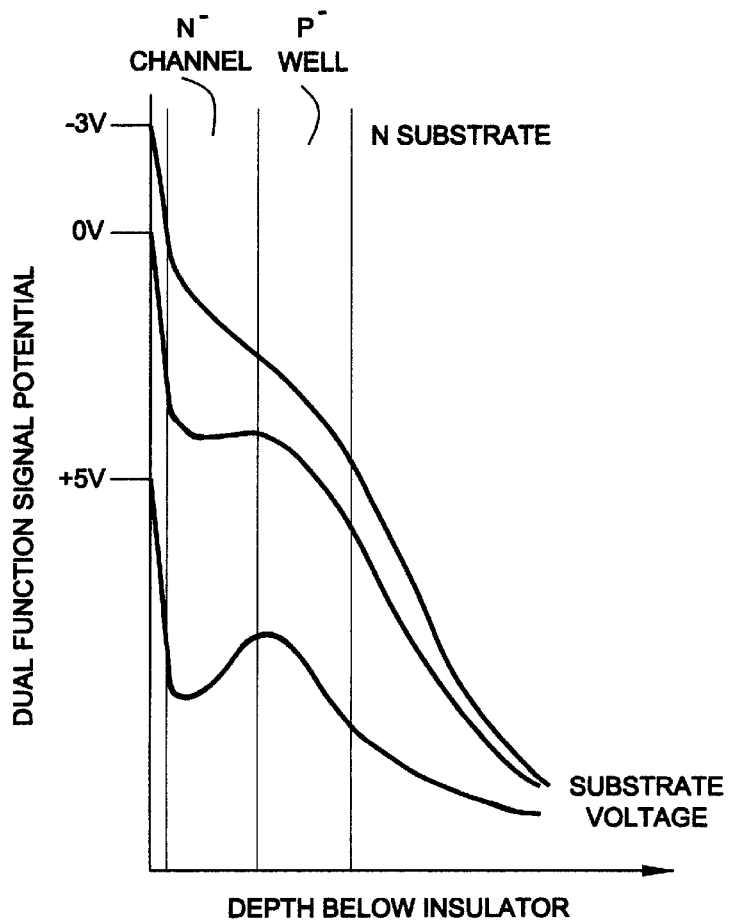
FIG. 7 is a graph depicting the relationship between the depth below clock electrode 128B and the potential at that depth for three signal levels applied to clock electrode 128B.

FIG. 7 is a graph of the relationship between the depth below a clock electrode of clock electrodes 128A, 128B, 128C and the potential at that depth for three signal levels applied to the clock electrode: the clock high value (e.g., +5 volts), the clock low value (e.g., 0 volts) and a reset value (e.g., −3 volts). When the clock high value is applied, a design maximum capacity well is formed as depicted in FIG. 6 as a "dip" in the potential within the channel depths. A local potential peak exists at the boundary between the channel and the well that acts as barrier to keep charges (e.g., electrons) from migrating into the substrate. This well (i.e., the dip) can hold charges (e.g., electrons) until sufficient charge is accumulated to make the potential in the channel more negative than the local peak of the barrier. Then, the excess charge overflows (e.g., blooms over) the local barrier and transfers into the substrate.

When the clock low value (e.g., 0 volts) is applied, a minimum capacity well is formed as depicted in FIG. 7 as a more or less flat potential zone within the channel depths. Very little, if any, charge may be held within the channel depths before the potential is sufficiently negative to overflow into the substrate.

When the reset value (e.g., −3 volts) is applied, no charge may be held in the channel depths. As depicted in FIG. 7 as a sloped potential zone within the channel depths, an electric field exists to accelerate charge into the substrate.

To help ensure that inter-junction separation is minimum at channel centers, the concentration of the dopant species used to define well 14 is preferably thinned near the centers of channel 126. This gives rise to the inter-junction separation being minimum near the center of the channel and maximum near channel edges. Then, when the reset value (e.g., −3 volts) is applied to a clock line of clock electrodes 128A, 128B, 128C, the inter-junction separation becomes zero as electrical junctions 132 and 134 make contact and charge is free to transfer from channel 126 into substrate 12 under the influence of the electrical field produced by the potential gradient (i.e., slope) depicted in the channel depths in FIG. 7.

In accordance with these teachings, a CCD sensor control structure for horizontal readout register 122 may be constructed to first clear signal charge in horizontal channel 126 through an anti-blooming structure, second transfer a line of signal charges under transfer electrode 108T into horizontal channel 126 at locations under clock electrodes 128B, and third shift the signal charges right (or left) past sensing electrode 128S to non-destructively readout the signal from multiple taps.

The use of an output at several points along a CCD horizontal readout register (HCCD) provides the means to readout the signal at a much faster rate. This requires that a break is made in the HCCD, which requires space on the wafer surface and is often impossible to accommodate without incorporating tapers or angles into the vertical CCD structure above. When an output diffusion node is placed in the HCCD, there is often insufficient space to optimize the design, resulting in a poor conversion gain. Bi-directional operation of the HCCD requires twice the number of outputs (two nodes per horizontal register segment) and hence connections to the device and the extra space required in the HCCD exacerbates the problems.

In the present invention, a floating gate output structure is inserted into the HCCD without the requirements of a standard floating diffusion node. The floating gate output samples the signal non-destructively and hence a drain is required to discharge the signal charge after readout is complete. This could be accomplished by adding a drain to each end of the HCCD, but would require the whole HCCD to be flushed after each line of readout which slows down the readout and removes most of the benefit of a multi-tapped HCCD. By using a vertial anti-blooming process (VAB process), the excess charge can be drained to the substrate directly through the application of a suitable bias to the HCCD gate electrodes. This does not necessarily require that the VAB structure employ a reduced VAB barrier along the centerline (e.g., through the use of a p-well spacing as may be used in the image region), but it may be advantageous to do so. In either case, a drain is not required. Of course, a drain could be provided along the length of the HCCD to allow a fast empty of the charge, but this structure would likely interfere with the construction of the output structure.

The HCCD may be read out in either direction by including a floating gate readout at each end of the HCCD. Depending on the direction of readout, one of these end location outputs would be inactive. This provides a bi-directional HCCD.

With a VAB structure, the floating gate output would not need to be reset for each HCCD pixel readout, which eliminates reset noise, the largest noise source in a floating diffusion output structure. Multiple readout of the same signal is possible since the readout is non-destructive and may be readout at the next sequential floating gate output. With proper signal processing, further noise reduction is achieved by averaging. The floating gate may need to be reset to a fixed potential due to stray charge accumulation. This can be achieved during transfer of lines of charges under transfer electrode 108T so that no reset noise occurs during data read out.

Since each floating gate output is non-destructive the same signal is available at the adjacent floating gate output structure after a suitable number of transfers. This allows the number of active output taps to be selected dynamically. For example, the sensor may be sensed at two taps spaced 16 pixels apart while 16 pixels are transferred down the register or at the second tap while 32 pixels are transferred.

With this combination, a sensor can be achieved that provides in one design the ability to select the direction of HCCD readout and the number of output taps.

The provision of extra dark pixels at each end of the HCCD provides reference pixels at the end of the data stream for the output structure at the end of the HCCD, which one of the two dark pixel groups depends on the direction of readout.

Bi-directionality is assured if the HCCD can be clocked in both directions (i.e., not 2-phase) and that charge can be sampled by the floating gate. There is the need for an output at both ends of the HCCD.

Having described preferred embodiments of novel control structures for a multi-tapped bi-directional CCD image sensor horizontal readout register (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A structure for a CCD sensor comprising:
   a well formed in a substrate;
   a channel formed in the well, the channel defining a channel direction;
   a clocking structure disposed over the channel and oriented transversely to the channel direction, the clocking structure including a plurality of register element sets, a first register element set including a first floating sensing conductor and a plurality of clock signal conductors.

2. The structure of claim 1, wherein the channel is incorporated in a horizontal readout register of the CCD sensor.

3. The structure of claim 1, wherein the channel is incorporated in a horizontal readout register of the CCD sensor, the horizontal readout register being selectively operable to transfer charges in either of two directions.

4. The structure of claim 1, wherein:
   the channel is incorporated in a horizontal readout register of the CCD sensor;

the first floating sensing conductor is disposed over a first end of the channel; and the clocking structure further includes an end floating sensing conductor disposed over a second end of the channel.

5. The structure of claim 4, further comprising first and second transistor switches, the first transistor switch being coupled between the first floating sensing conductor and an external bias potential, the second transistor switch being coupled between the end floating sensing conductor and the external bias potential.

6. The structure of claim 4, wherein the clocking structure further includes a second register element set disposed between the first register element set and the end floating sensing conductor.

7. The structure of claim 6, wherein the second register element set includes a second floating sensing conductor disposed substantially midway between the first floating sensing conductor and the end floating sensing conductor.

8. The structure of claim 7, further comprising first and second transistor switches, the first transistor switch being coupled between the first floating sensing conductor and an external bias potential, the second transistor switch being coupled between the second floating sensing conductor and the external bias potential.

9. The structure of claim 7, further including first, second and third MOS transistors, wherein:

the first floating sensing conductor is coupled to a gate of the first MOS transistor;

the second floating sensing conductor is coupled to a gate of the second MOS transistor; and the end floating sensing conductor is coupled to a gate of the third MOS transistor.

10. The structure of claim 1, further including a first MOS transistor wherein the first floating sensing conductor is coupled to a gate of the first MOS transistor.

11. The structure of claim 10, further including a second MOS transistor coupled between the first floating sensing conductor and an external bias potential.

12. The structure of claim 1, wherein:

the plurality of clock signal conductors includes a first clock signal conductor;

a first electrical junction is defined at an electrical semiconductor junction between the well and the substrate;

a second electrical junction is defined at an electrical semiconductor junction between the channel and the well;

the first and second electrical junctions define an inter-junction separation under the first clock signal conductor;

the well is formed in the substrate and the channel is formed in the well so that a length of the inter-junction separation is controllable by a first clock signal applied to the first clock signal electrode.

13. The structure of claim 12, further comprising a clock signal source to provide the first clock signal coupled to the first clock signal conductor, the first clock signal being characterized by a selectable clock value, the selectable clock value being one of a clock high value, a clock low value and a reset value, the clock low value being a value between the clock high value and the reset value.

14. The structure of claim 12, wherein the length of the inter-junction separation is zero when the first clock signal is the reset value.

15. The structure of claim 1, further comprising a transistor switch coupled between the first floating sensing conductor and an external bias potential.

16. The structure of claim 15, wherein the transistor switch is a MOS transistor.

17. A method of using the structure of claim 1, wherein the channel and clocking structure form a horizontal readout register, the method comprising steps of:

clearing signal charges from the horizontal readout register;

transferring a line of signal charges into the horizontal readout register from an imaging area; and shift the line of signal charges in the horizontal readout register past a plurality of floating sensing conductors.

18. The method of claim 17, further comprising a step of amplifying signals sensed at the plurality of floating sensing conductors.

19. The method of claim 17, wherein:

the horizontal readout register includes a clocking structure disposed over a channel formed in a well in a substrate, the clocking structure having a plurality of register element sets, each of the floating sensing conductors being a conductor of a respective register element set;

each register element set further includes a first clock signal conductor;

the step of clearing includes applying a sufficient bias potential to each first clock signal conductor so as to electrically couple a region of the channel disposed under the first clock signal conductor to the substrate.

20. The method of claim 17, wherein the step of transferring includes resetting a potential on each of the floating sensing conductors to an external bias potential.

21. The method of claim 20, wherein the step of resetting includes electrically coupling each of the floating sensing conductors through respective transistor switches to the external bias potential.

22. The method of claim 17, wherein the step of shifting includes selecting a direction for shifting the line of signal charges, the direction being either of two directions.

23. The method of claim 17, wherein the step of shifting includes non-destructively sensing the line of signal charges at the plurality of floating sensing conductors.

24. The method of claim 17, wherein the step of shifting includes:

non-destructively sensing the line of signal charges at the plurality of floating sensing conductors; and repeatatively shifting so as to readout in time each charge packet in the line of signal charges at least twice.

25. The structure of claim 1, further comprising a reset structure to enable charge stored in the channel to be discharged.

26. The structure of claim 25, wherein the reset structure includes circuitry to apply a reset voltage to clock signal conductors of each register element set to enable charge stored in the channel under the clock signal conductors to be discharged.

27. The structure of claim 1, wherein the first floating sensing conductor is capable of being operated to permit non-destructive sensing of charge in the channel beneath the first floating sensing conductor.

* * * * *